(12) United States Patent
Liu et al.

(10) Patent No.: US 7,319,262 B2
(45) Date of Patent: Jan. 15, 2008

(54) MRAM OVER SLOPED PILLAR

(75) Inventors: Chi-Wen Liu, Hsinchu (TW);
Kuo-Ching Chiang, Tao-Yuan (TW);
Horng-Huei Tseng, Hsin-Chu (TW);
Denny D. Tang, Saratoga, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 316 days.

(21) Appl. No.: 10/917,585

(22) Filed: Aug. 13, 2004

(65) Prior Publication Data

US 2006/0033136 A1   Feb. 16, 2006

(51) Int. Cl.
*H01L 29/82* (2006.01)
*H01L 43/00* (2006.01)
*H01L 21/00* (2006.01)

(52) U.S. Cl. .............................. 257/421; 257/E21.665; 257/296; 438/3

(58) Field of Classification Search ............... 257/295, 257/296, 414, 659, E21.665, 421; 438/3
See application file for complete search history.

(56) References Cited

U.S. PATENT DOCUMENTS

| | | | |
|---|---|---|---|
| 5,705,973 A * | 1/1998 | Yuan et al. ............... 338/32 R |
| 6,185,077 B1 * | 2/2001 | Tong et al. ............ 360/324.11 |
| 6,518,071 B1 * | 2/2003 | Durlam et al. ................. 438/3 |
| 6,611,453 B2 | 8/2003 | Ning |
| 6,621,730 B1 * | 9/2003 | Lage .......................... 365/158 |
| 6,818,961 B1 * | 11/2004 | Rizzo et al. ................ 257/422 |
| 6,965,138 B2 * | 11/2005 | Nakajima et al. ........... 257/295 |
| 6,967,864 B2 * | 11/2005 | Kajiyama .................... 365/158 |
| 7,102,916 B2 * | 9/2006 | Trouilloud et al. ......... 365/158 |
| 2002/0191354 A1 * | 12/2002 | Yoshikawa et al. ....... 360/324.1 |
| 2004/0012056 A1 * | 1/2004 | Nejad et al. ................ 257/414 |
| 2005/0232005 A1 * | 10/2005 | Lin et al. .................... 365/171 |
| 2005/0276099 A1 * | 12/2005 | Horng et al. ............... 365/158 |
| 2006/0002184 A1 * | 1/2006 | Hong et al. ................. 365/171 |
| 2006/0033133 A1 * | 2/2006 | Liu et al. .................... 257/295 |

* cited by examiner

*Primary Examiner*—B. William Baumeister
*Assistant Examiner*—Igwe U. Anya
(74) *Attorney, Agent, or Firm*—Haynes and Boone, LLP

(57) ABSTRACT

An apparatus including a pillar located over a substrate and having at least one sloped surface oriented at an acute angle relative to the substrate. The apparatus also includes an MRAM stack substantially conforming to the sloped surface, the MRAM stack thereby also oriented at the acute angle relative to the substrate. The MRAM stack may comprise a plurality of substantially planar, parallel layers each oriented at an acute angle relative to the substrate.

35 Claims, 6 Drawing Sheets

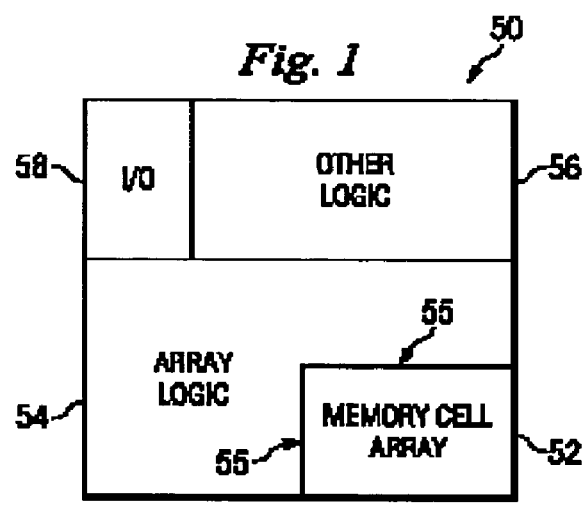
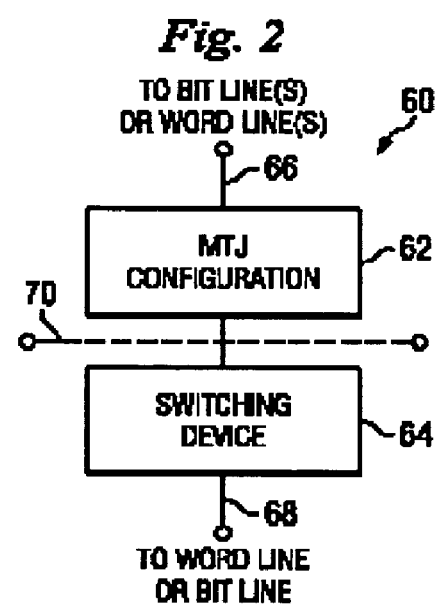

MRAM OVER SLOPED PILLAR

RELATED APPLICATION

The present application is related to U.S. Provisional Patent Application No. 60/601,281, filed Aug. 13, 2004, entitled "MRAM CELL HAVING SHARED CONFIGURATION," and U.S. patent application Ser. No. 11/053,379, filed Feb. 8, 2005, now U.S. Pat. No. 7,221,584, issued May 22, 2007, entitled "MRAM CELL HAVING SHARED CONFIGURATION," having common inventorship and ownership and filed concurrently herewith.

BACKGROUND

A magnetic random access memory (MRAM) device may include an MRAM stack having a dielectric layer interposing a fixed or pinned magnetic layer and a free magnetic layer. Each of the MRAM stack layers is substantially planar and oriented parallel to a surface over which the MRAM device is formed. However, cell density of integrated circuits and other devices incorporating one or more such MRAM devices is limited by the parallel orientation of the MRAM stack layers and the predetermined amount of surface area required at the interfaces between the MRAM stack layers (i.e., the lateral dimensions of each MRAM stack).

It follows that cell density may be increased by orienting each of the MRAM stack layers perpendicular to the underlying substrate. However, such embodiments introduce substantial complexity into existing manufacturing processes. Turning the MRAM stacks on-end also increases the overall height of the integrated circuit or other device incorporating such vertical MRAM stacks.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 1 is a block diagram of one embodiment of an integrated circuit device having a memory cell array according to aspects of the present disclosure.

FIG. 2 is a block diagram of one embodiment of a memory cell for use in the memory cell array shown in FIG. 1 according to aspects of the present disclosure.

DETAILED DESCRIPTION

Figure 3A:
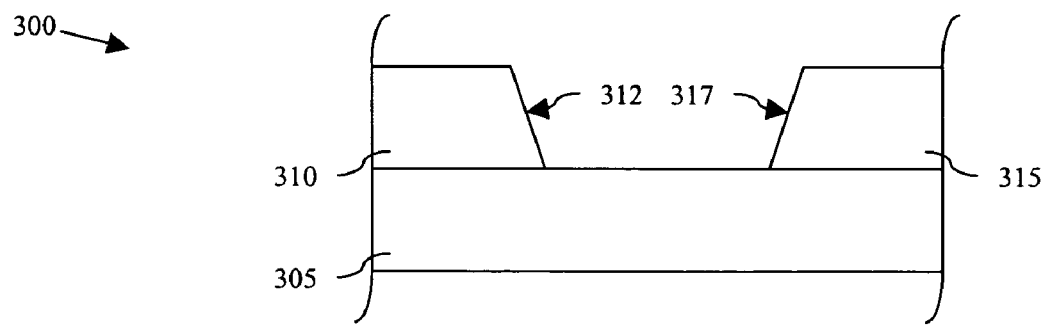
FIG. 3a is a sectional view of at least a portion of one embodiment of an apparatus in an intermediate stage of manufacture according to aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is a block diagram of one embodiment of an integrated circuit 50 that is one example of a circuit that can benefit from aspects of the present disclosure. The integrated circuit 50 includes a memory cell array 52 that can be controlled by an array logic 54 through an interface 55. It is well known in the art that various logic circuitry, such as row and column decoders and sense amplifiers, can be included in the array logic 54, and that the interface 55 may include one or more bit lines, gate lines, digit lines, control lines, word lines, and other communication paths to interconnect the memory cell array 52 with the array logic 54. The integrated circuit can further include other logic 56, such as counters, clock circuits, and processing circuits, and input/output circuitry 58, such as buffers and drivers.

Referring to FIG. 2, the memory cell array 52 of FIG. 1 may include one or more magnetic random access memory (MRAM) cells 60. Each MRAM cell 60 does not need to be commonly configured, but for the sake of example, can be generically described as including a configuration of MRAM stacks in MTJ devices 62 and a switching device 64. Examples of various embodiments of the MTJ devices 62 are discussed in further detail below, and examples of the switching device 64 include a metal oxide semiconductor (MOS) transistor, an MOS diode, and/or a bipolar transistor. The memory cell 60 can store 1, 2, 3, 4 or more bits.

The MRAM cell 60 may include three terminals, a first terminal 66, a second terminal 68, and a third terminal 70. For the sake of example, the first terminal 66 is connected to one or more bit lines and produces an output voltage in a read operation, which is provided to the bit line(s). The second terminal 68 is connected to one or more word lines, which can activate the cell 60 for a read or write operation. The third terminal 70 may be proximate a control line, such as a gate or digit line, and can provide a current for producing a magnetic field to effect the MTJ configuration 62. It is understood that the arrangement of bit lines, word lines, control lines, and other communication signals can vary for different circuit designs, and the present discussion is only providing one example of such an arrangement.

Referring to FIG. 3a, illustrated is a sectional view of at least a portion of one embodiment of an apparatus 300 in an intermediate stage of manufacture according to aspects of the present disclosure. The apparatus 300 may include one or more pillars 310, 315 formed over a substrate 305. The apparatus 300 may also include more than the two pillars 310, 315 shown in FIG. 3. The pillars 310, 315 may be formed directly on the substrate 305, although one or more other layers, features, or components may also interpose the substrate 305 and one or both of the pillars 310, 315.

The substrate may comprise silicon, gallium arsenide, and/or other materials. In one embodiment, the substrate 305 is or comprises a silicon-on-insulator (SOI) substrate, such as a substrate comprising an epitaxially grown or otherwise formed semiconductor layer on an insulator layer. The substrate 305 may also comprise one or more conductive and/or insulating layers located thereon, such as those that may be employed to form active and/or passive devices and/or a device interconnect structure. Thus, reference herein to the substrate 305 may refer to a wafer on which a plurality of layers are formed, such as a silicon ingot, but may also refer to one or more such layers which may be formed on or over such a wafer.

The pillars 310, 315 may comprise one or more electrically conductive materials such as aluminum, gold, tungsten, alloys thereof, and/or other electrically conductive materials. The pillars 310, 315 may also or alternatively comprise one or more dielectric materials such as silicon dioxide, tetraethylorthosilicate (TEOS), glass, SILK (a product of Dow Chemical), BLACK DIAMOND (a product of Applied Materials), and/or other electrically insulating materials. The pillars 310, 315 may also or alternatively comprise one or more magnetic materials, including ferromagnetic, anti-ferromagnetic, and/or hard-magnetic materials. For example, the pillars 310, 315 may comprise NiFe, NiFeCo, CoFe, Fe, Co, Ni, alloys or compounds thereof, and/or other magnetic materials.

The pillars 310, 315 may be formed by chemical-vapor deposition (CVD), rapid thermal CVD (RTCVD), plasma enhanced CVD (PECVD), sputtering, and/or other processes, including processes other than CVD-type processes. The pillars 310, 315 may be selectively deposited or blanket deposited accompanied by subsequent patterning, such as by wet or dry etching. The thickness of the pillars 310, 315 may range between about 50 nm and about 1000 nm, although other thicknesses are also within the scope of the present disclosure.

The pillars 310, 315 have surfaces 312, 317 that are sloped relative to the substrate. The sloped surfaces 312, 317 of the pillars 310, 315 may be oriented at an acute angle relative to the substrate 305. For example, the surfaces 312, 317 may be angularly offset from the substrate 305 by an angle ranging between about 60 degrees and about 88 degrees. In one embodiment, the angular offset of the surfaces 312, 317 relative to the substrate 305 may range between about 70 and 80 degrees. For example, in the embodiment shown in FIG. 3a, the angular offset of the surfaces 312, 317 relative to the substrate 305 is about 70 degrees. However, each of the surfaces 312, 317 of the pillars 310, 315 may not be angularly offset from the substrate 305 by the same angle. That is, while each surface 312, 317 may be angularly offset from the substrate 305 by an acute angle, the surface 312 may be angularly offset from the substrate 305 by an acute angle different than the angular offset of the surface 317. In one embodiment, only one of the surfaces 312, 317 may be angularly offset from the substrate 305, wherein the other of the surface 312, 317 may be substantially perpendicular to the substrate 305.

Figure 3B:
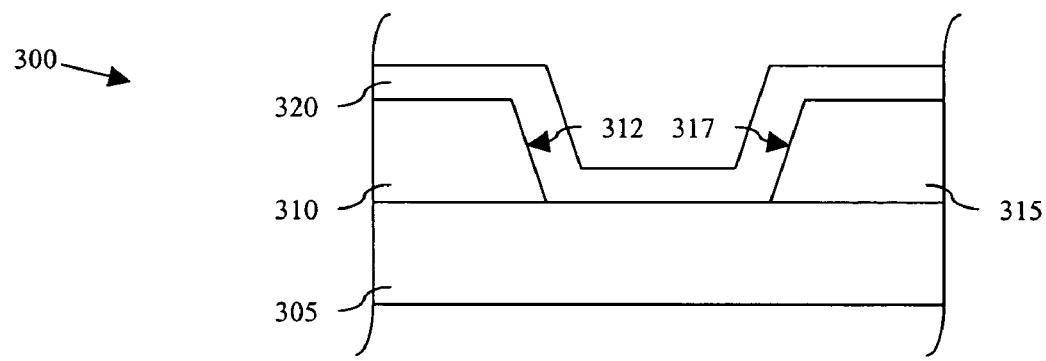
FIG. 3b is a sectional view of the apparatus shown in FIG. 3a in a subsequent stage of manufacture.

Referring to FIG. 3b, illustrated is a sectional view of the apparatus 300 shown in FIG. 3a in a subsequent stage of manufacture in which a magnetic layer 320 has been formed over the pillars 310, 315, the sloped surface 312, 317 of the pillars 310, 315, and a portion of the substrate 305 exposed between the pillars 310, 315. The magnetic layer 320 may have a thickness ranging between about 1 nm and about 20 nm, although other thickness are within the scope of the present disclosure. Also, while the magnetic layer 320 is illustrated as being formed directly on the sloped pillar surfaces 312, 317, other layers, features, or components may interpose the pillars 310, 315 and the magnetic layer 320.

The magnetic layer 320 may comprise NiFe, NiFeCo, CoFe, Fe, Co, Ni, alloys or compounds thereof, and/or other magnetic materials and, as such, may be employed to subsequently form a free or pinned magnetic layer. The magnetic layer 320 may also comprise a plurality of layers, such as a Ru spacer interposing two or more magnetic layers or other combinations forming a synthetic anti-ferromagnetic (SAF) layer. Although not limited within the scope of the present disclosure, the magnetic layer 320 may be formed by blanket deposition employing such processes as CVD, RTCVD, PECVD, sputtering, and/or other processes, including processes other than CVD-type processes.

Figure 3C:
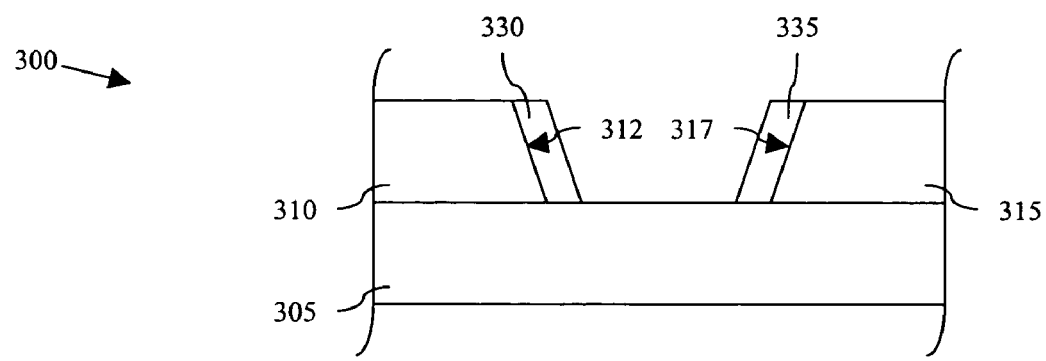
FIG. 3c is a sectional view of the apparatus shown in FIG. 3b in a subsequent stage of manufacture.

Referring to FIG. 3c, illustrated is a sectional view of the apparatus 300 shown in FIG. 3b in a subsequent stage of manufacture in which at least a portion of the magnetic layer 320 has been removed to form magnetic MRAM stack layers 330, 335. For example, one or more isotropic and/or anisotropic etching processes may be performed to define the magnetic MRAM stack layers 330, 335, possibly employing a patterned photoresist or other mask. Such material removal may employ the pillars 310, 315 and/or the substrate 305 for end-point detection. Moreover, although not shown in the illustrated embodiment, the material removal process(es) employed to define the magnetic MRAM stack layers 330, 335 from the magnetic layer 320 may leave one or more of the distal edges of the magnetic MRAM stack layers 330, 335 relative to the substrate 305 (e.g., upper edges in FIG. 3c) with a rounded profile.

By forming the magnetic MRAM stack layers 330, 335 in the above-described manner, the magnetic MRAM stack layers 330, 335 may substantially conform to the sloped surfaces 312, 317 of the pillars 310, 315. However, processes other than those described above may also or alternatively be employed to form the magnetic MRAM stack layers 330, 335. For example, chemical-mechanical planarizing and/or polishing (hereafter collectively referred to as CMP) may be employed to removed portions of the magnetic layer 320 from over the pillars 310, 315, possibly employing the pillars 310, 315 for end-point detection. The magnetic MRAM stack layers 330, 335 may also or alternatively be formed by selective deposition on or over the sloped pillar surfaces 312, 317. Nonetheless, in some embodiments, one or both of the distal ends of each of the magnetic MRAM stack layers 330, 335 may be substantially coplanar with or otherwise aligned with the upper and lower surfaces of the pillars 310, 315, relative to the illustration in FIG. 3c.

Because the magnetic MRAM stack layers 330, 335 may substantially conform to the sloped pillar surfaces 312, 317, the magnetic MRAM stack layers 330, 335 may also be oriented at an acute angle relative to the substrate 305, such as at an angle ranging between about 60 degrees and about 88 degrees. In one embodiment, the magnetic MRAM stack layers 330, 335 are oriented at an angle ranging between about 70 degrees and about 80 degrees.

In some embodiments, the lateral surfaces of one or both of the magnetic MRAM stack layers 330, 335 may not be mutually substantially parallel or individually planar. In such embodiments, the orientation of the magnetic MRAM stack layers 330, 335 at an acute angle relative to the substrate 305 may be measured from one of the sidewall surfaces of the corresponding one of the magnetic MRAM stack layers 330, 335 that is substantially planar. Such orientation may also be measured from a best-fit plane of one of the sidewall surfaces of the corresponding one of the magnetic MRAM stack layers 330, 335 that may not be substantially planar. The angular offset may also be measured from a hypothetical center plane of the corresponding one of the magnetic MRAM stack layers 330, 335, wherein the center plane may represent a weighted or other average of the sidewall surfaces of the corresponding one of the magnetic MRAM stack layers 330, 335. In one embodiment, at least one of the sloped surfaces 312, 317 may be substantially cylindrical, wherein the angular offset thereof may be measured from the center-line axis of the cylindrical surface.

Figure 3D:
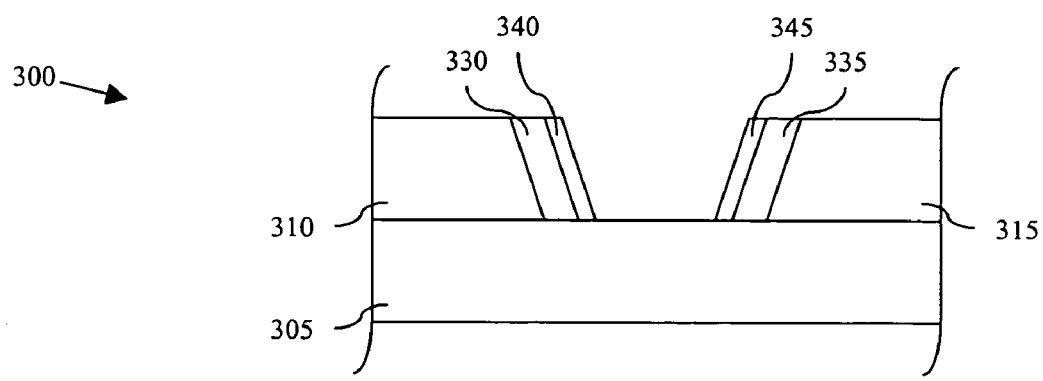
FIG. 3d is a sectional view of the apparatus shown in FIG. 3c in a subsequent stage of manufacture.

Referring to FIG. 3d, illustrated is a sectional view of the apparatus 300 shown in FIG. 3c in a subsequent stage of manufacture in which dielectric MRAM stack layers 340, 345 have been formed adjacent the magnetic MRAM stack layers 330, 335. The dielectric MRAM stack layers 340, 345 may be formed by one or more of the processes described above that may be employed to form the magnetic layer 320. For example, the dielectric MRAM stack layers 340, 345 may be formed by CVD followed by an etch or other material removal process. The dielectric MRAM stack layers 340, 345 may also each comprise more than one layer. Also, while the dielectric MRAM stack layers 340, 345 are illustrated as being formed directly on the magnetic MRAM stack layers 330, 335, other layers, features, or components may interpose the dielectric MRAM stack layers 340, 345 and the magnetic MRAM stack layers 330, 335.

One or both of the dielectric MRAM stack layers 340, 345 may be a tunneling layer or other dielectric layer. For example, the dielectric MRAM stack layers 340, 345 may comprise $SiO_x$, $SiN_x$, $SiO_xN_y$, $AlO_x$, $TO_x$, $TiO_x$, $AlN_x$, alloys or compounds thereof, and/or other electrically insulating materials. The dielectric MRAM stack layers 340, 345 may have a thickness ranging between about 0.5 nm and about 2 nm, possibly measured in a direction substantially perpendicular to one of the sloped pillar surfaces 312, 317. Moreover, the dielectric MRAM stack layers 340, 345 may substantially conform to a corresponding one of the magnetic MRAM stack layers 330, 335, such that the dielectric MRAM stack layers 340, 345 may be similarly oriented at an acute angle relative to the substrate 305.

Figure 3E:
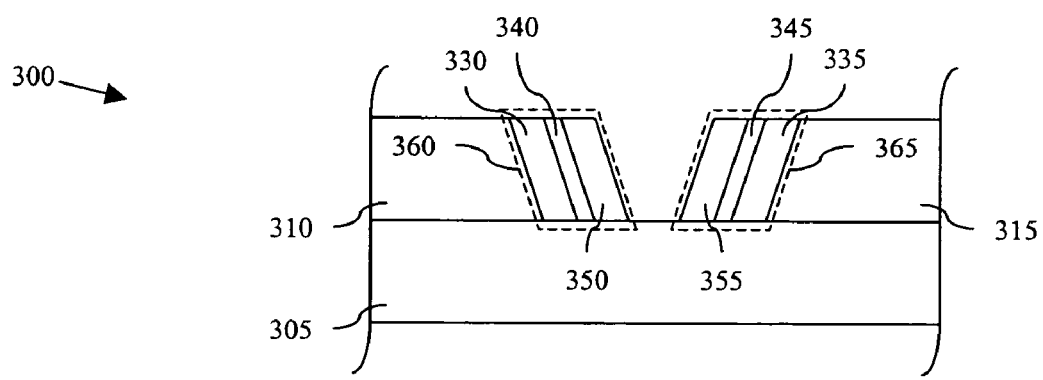
FIG. 3e is a sectional view of the apparatus shown in FIG. 3d in a subsequent stage of manufacture.

Referring to FIG. 3e, illustrated is a sectional view of the apparatus 300 shown in FIG. 3d in a subsequent stage of manufacture in which magnetic MRAM stack layers 350, 355 have been formed adjacent the dielectric MRAM stack layers 340, 345. While the magnetic MRAM stack layers 350, 355 are illustrated as being formed directly on the dielectric MRAM stack layers 340, 345, other layers, features, or components may interpose the magnetic MRAM stack layer 350, 355 and the dielectric MRAM stack layers 340, 345.

The completion of the magnetic MRAM stack layers 350, 355 may complete MRAM stacks 360, 365. That is, the MRAM stack 360 may comprise the magnetic MRAM stack layer 330, the dielectric MRAM stack layer 340, and the magnetic MRAM stack layer 350, wherein one of the magnetic MRAM stack layers 330, 350 may be a free magnetic layer and the other of the magnetic MRAM stack layers 330, 350 may be a fixed or pinned magnetic layer. Similarly, the MRAM stack 365 may comprise the magnetic MRAM stack layer 335, the dielectric MRAM stack layer 345, and the magnetic MRAM stack layer 355, wherein one of the magnetic MRAM stack layers 335, 355 may be a free magnetic layer and the other of the magnetic MRAM stack layers 335, 355 may be a fixed or pinned magnetic layer. However, in some embodiments, the MRAM stacks 360, 365 may comprise alternative or additional layers.

The magnetic MRAM stack layers 350, 355 may comprise NiFe, NiFeCo, CoFe, Fe, Co, Ni, alloys or compounds thereof, and/or other magnetic materials, including ferromagnetic or anti-ferromagnetic materials. Also, as described above, the magnetic MRAM stack layers 350, 355 may also each be or comprise a free or pinned magnetic layer.

One or both of the magnetic MRAM stack layers 350, 355 may also comprise a plurality of layers, such as a Ru spacer interposing two or more magnetic layers or other combinations forming a synthetic anti-ferromagnetic (SAF) layer. The thickness of the magnetic MRAM stack layers 350, 355 may also be substantially similar to the thickness of the magnetic MRAM stack layers 330, 335. Although not limited within the scope of the present disclosure, the magnetic MRAM stack layers 350, 355 may be substantially similar in manufacture to the magnetic MRAM stack layers 330, 335, with the exception that the magnetic MRAM stack layers 330, 335, 350, 355 collectively form corresponding pairs of free and pinned magnetic MRAM stack layers as necessary to form MTJ MRAM stacks.

The magnetic MRAM stack layers 350, 355 may substantially conform to a corresponding one of the magnetic MRAM stack layers 330, 335, such that the dielectric MRAM stack layers 350, 355 may be similarly oriented at an acute angle relative to the substrate 305. Consequently, the MRAM stacks 360, 365 may also be oriented an acute angle relative to the substrate 305. For example, the MRAM stacks 360, 365 may each be angularly offset from the substrate 305 by an angle ranging between about 60 degrees and about 88 degrees. In one embodiment, one or both of the MRAM stacks 360, 365 may be angularly offset from the substrate 305 by an angle ranging between about 70 degrees and about 80 degrees.

Figure 3F:
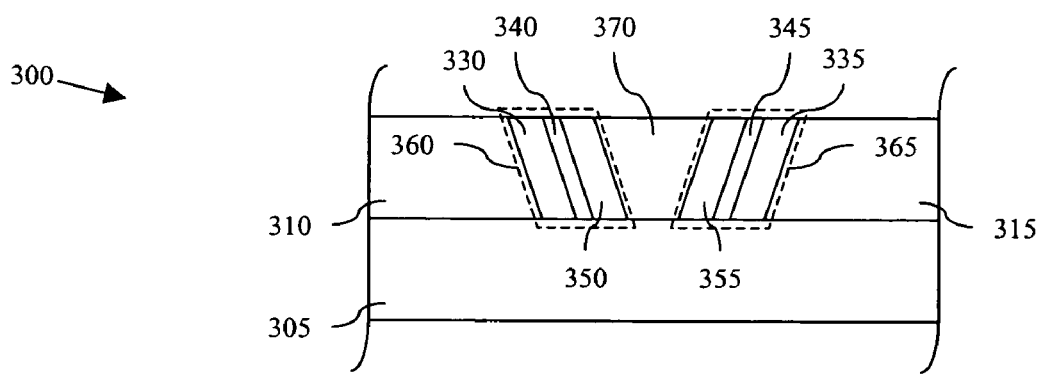
FIG. 3f is a sectional view of the apparatus shown in FIG. 3e in a subsequent stage of manufacture.

Referring to FIG. 3f, illustrated is a sectional view of the apparatus 300 shown in FIG. 3e in a subsequent stage of manufacture in which a central member 370 has been formed interposing and contacting the MRAM stacks 360, 365. The central member 370 may comprise one or more electrically conductive materials such as aluminum, gold, tungsten, alloys thereof, and/or other electrically conductive materials. The central member 370 may also or alternatively comprise one or more dielectric materials such as silicon dioxide, tetraethylorthosilicate (TEOS), glass, BLACK DIAMOND, and/or other electrically insulating materials. The central member 370 may also or alternatively comprise one or more magnetic materials, including ferromagnetic, anti-ferromagnetic, and/or hard-magnetic materials. For example, the central member 370 may comprise NiFe, NiFeCo, CoFe, Fe, Co, Ni, alloys or compounds thereof, and/or other magnetic materials.

The central member 370 may be formed by CVD, RTCVD, PECVD, sputtering, and/or other processes, including processes other than CVD-type processes. The central member 370 may be selectively deposited or blanket deposited accompanied by CMP. The thickness of the central member 370 may range between about 10 nm and about 1000 nm, or otherwise substantially similar to the thickness of one or both of the pillars 310, 315, although other thicknesses are also within the scope of the present disclosure. The central member 370 and/or the pillars 310, 315 may be employed in the interconnection of the MRAM stacks 360, 365, possibly in conjunction an interconnect structure contacting the central member 370 and/or the pillars 310, 315.

Figure 4:
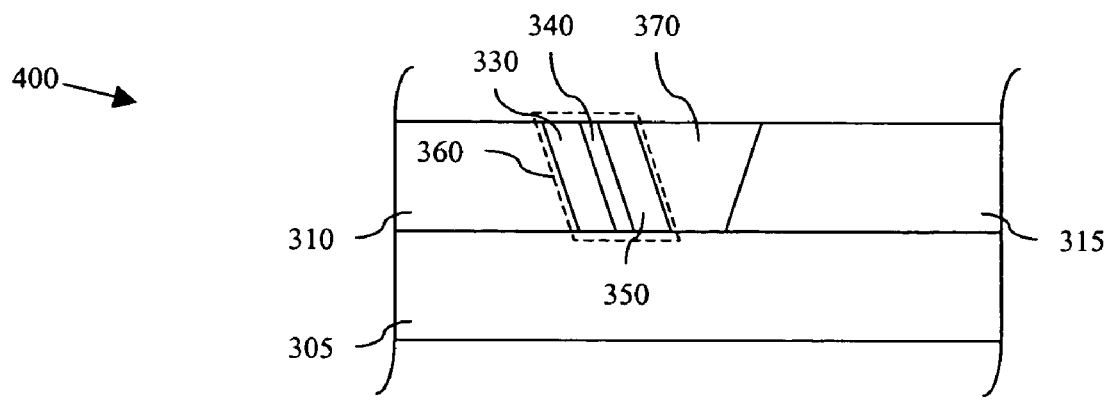
FIG. 4 is a sectional view of at least a portion of one embodiment of the apparatus shown in FIG. 3f.

Referring to FIG. 4, illustrated is a sectional view of at least a portion of another embodiment of the apparatus 300 shown in FIG. 3f, herein designated by the reference number 400. The apparatus 400 is substantially similar to the apparatus 300 shown in FIG. 3f. However, the apparatus 400 may be employed as a one-bit memory cell, whereas the apparatus 300 shown in FIG. 3f may be employed as a memory cell comprising two bits. That is, the recess between proximate pillars 310, 315 in the apparatus 400 may contain only one MRAM stack 360, whereas the recess between proximate pillars 310, 315 in the apparatus 300 may contain two or more MRAM stacks 360, 365. Moreover, although the pillars 310, 315 in the apparatus 400 are illustrated as each having a sloped surface, the pillar 315 to which the MRAM stack 360 does not substantially conform may not have a sloped surface.

Figure 5:
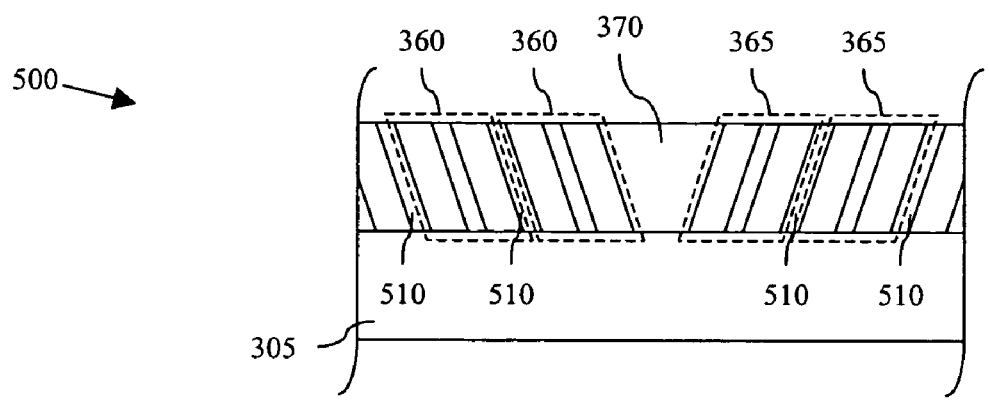
FIG. 5 is a sectional view of at least a portion of one embodiment of the apparatus shown in FIG. 3f.

Referring to FIG. 5, illustrated is a sectional view of at least a portion of another embodiment of the apparatus 300 shown in FIG. 3f, herein designated by the reference number 500. The apparatus 500 is substantially similar to the apparatus 300 shown in FIG. 3f. However, the apparatus 500 may be employed as a multi-bit memory cell, or as more than one memory cell. That is, the recess between proximate pillars 310, 315 in the apparatus 500 may contain a plurality of MRAM stacks 360, 365. For example, the illustrated portion of the apparatus 500 includes four MRAM stacks 360, 365, as well as portions of additional, neighboring MRAM stacks. The apparatus 500 may also include additional dielectric layers 510 interposing proximate ones of the MRAM stacks 360, 365. The dielectric layers 510 may each be substantially similar in composition and manufacture to the dielectric MRAM stack layers 340, 345 described above, although other types of materials and processes may also be employed to form the dielectric layers 510.

Figure 6:
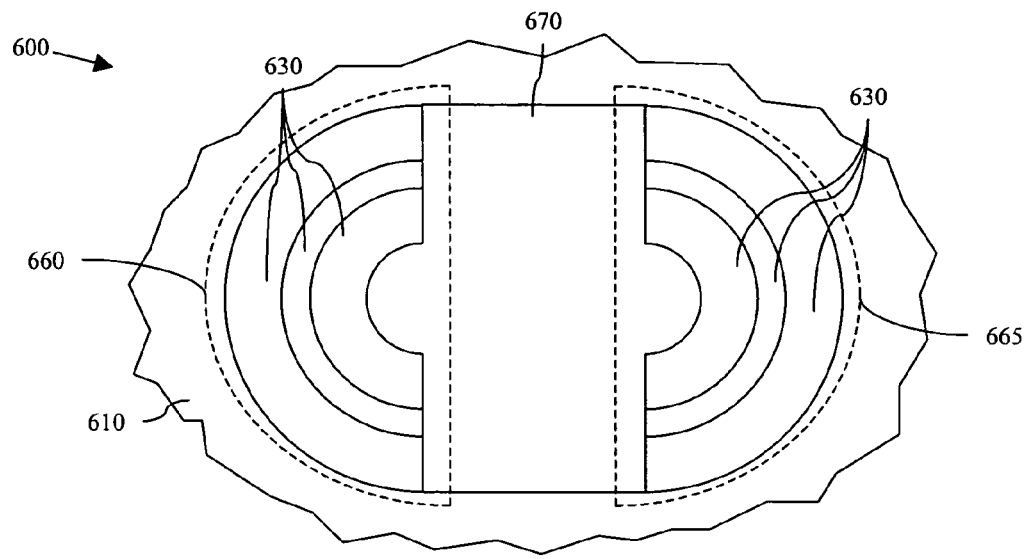
FIG. 6 is a top view of at least a portion of one embodiment of the apparatus shown in FIG. 3f.

Referring to FIG. 6, illustrated is a top view of at least a portion of one embodiment of the apparatus 300 shown in FIG. 3f, herein designated by the reference numeral 600. The apparatus 600 includes one or more MRAM stacks 660, 665, each of which may be substantially similar in composition and manufacture to one of the MRAM stacks 360, 365 shown in FIG. 3f. In the embodiment shown in FIG. 6, the apparatus 600 includes two MRAM stacks 660, 665. However, in other embodiments, the apparatus 600 may include only one of the MRAM stacks 660, 665, or may include more than the two MRAM stacks 660, 665 shown in FIG. 6.

The apparatus 600 also includes one or more pillars 610 formed over a substrate, and which may be substantially similar in composition and manufacture to the pillars 310, 315 described above. The pillars 610 may have a substantially cylindrical surface having a center axis oriented at an acute angle relative to the underlying substrate. In the illustrated embodiment, the pillar 610 includes an elongated, oval-shaped recess, wherein the ends of the recess are sloped relative to the underlying substrate, thereby forming substantially cylindrical surfaces angularly offset from the underlying substrate. The MRAM stacks 660, 665 are formed over the sloped, cylindrical surfaces of the pillar 610. In another embodiment, individual pillars may be employed to provide each substantially cylindrical, angularly offset surface on or over which an MRAM stack is formed.

Moreover, although not visible in FIG. 6, each of the MRAM stacks 660, 665 may substantially conform to the angularly offset, substantially cylindrical surfaces of the pillars 610, such that each of the MRAM stacks 660, 665 are also oriented at an acute angle relative to the substrate and may have a semi-circular or otherwise arcuate footprint. For example, in the illustrated embodiment, each of the MRAM stacks 660, 665 comprise a plurality of substantially concentric MRAM stack layers 630 each having a semi-circular footprint.

The apparatus 600 may also include a central member 670 interposing and contacting the MRAM stacks 660, 665. The central member 670 may be substantially similar in composition and manufacture to the central member 370 described above. For example, the central member 670 may comprise magnetic, electrically conductive, and/or dielectric material, as may be needed to interconnect the MRAM stacks 660, 665.

Figure 7:
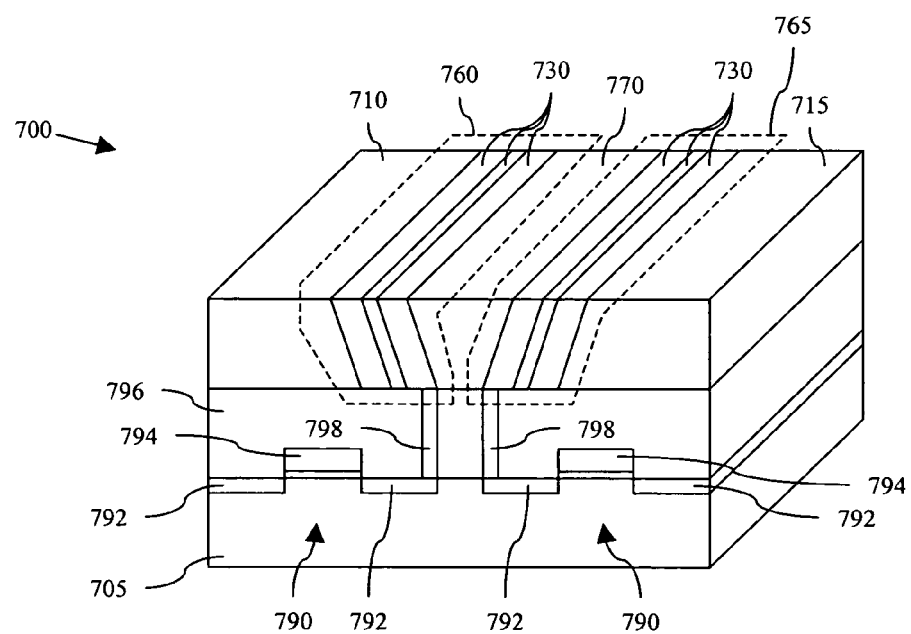
FIG. 7 is a perspective view of at least a portion of one embodiment of the apparatus shown in FIG. 3f.

Referring to FIG. 7, illustrated is a perspective view of at least a portion of one embodiment of the apparatus 300 shown in FIG. 3f, herein designated by the reference numeral 700. The apparatus 700 includes one or more MRAM stacks 760, 765, each of which may be substantially similar in composition and manufacture to one of the MRAM stacks 360, 365 shown in FIG. 3f. In the embodiment shown in FIG. 7, the apparatus 700 includes two MRAM stacks 760, 765. However, in other embodiments, the apparatus 700 may include only one of the MRAM stacks 760, 765, or may include more than the two MRAM stacks 760, 765 shown in FIG. 7.

The apparatus 700 also includes one or more pillars 710, 715 formed over a substrate 705, and which may be substantially similar in composition and manufacture to the pillars 310, 315 described above. The pillars 710, 715 may each have a substantially planar surface oriented at an acute angle relative to the substrate 705. In the illustrated embodiment, the pillars 710, 715 defined an elongated, rectilinear recess having a substantially trapezoidal cross-sectional shape, wherein the sides of the recess are sloped relative to the substrate 705, thereby forming substantially planar surfaces angularly offset from the substrate 705.

The MRAM stacks 760, 765 are formed over the sloped, substantially planar surfaces of the pillars 710, 715. Thus, each of the MRAM stacks 760, 765 may substantially conform to the angularly offset, substantially planar surfaces of the pillars 710, 715, such that each of the MRAM stacks 760, 765 are also oriented at an acute angle relative to the substrate, and may have a substantially linear or rectilinear footprint. For example, in the illustrated embodiment, each of the MRAM stacks 760, 765 comprise a plurality of substantially parallel MRAM stack layers 730 each having a rectilinear footprint.

The apparatus 700 may also include a central member 770 interposing and contacting the MRAM stacks 760, 765. The central member 770 may be substantially similar in composition and manufacture to the central member 370 described above. For example, the central member 770 may comprise magnetic, electrically conductive, and/or dielectric material, as may be needed to interconnect the MRAM stacks 760, 765.

The apparatus 700 may also include one or more microelectronic devices 790, possibly interconnected with one or more of the MRAM stacks 760, 765. For example, in the illustrated embodiment, the microelectronic devices 790 are field effect transistors each having source/drain regions 792 formed in the substrate 705 and gate electrodes 794 formed in a dielectric layer 796 formed over the substrate 705. However, other types of microelectronic devices 790 may also be employed within the scope of the present disclosure. For example, the microelectronic devices 790 may be or comprise transistors other than field effect transistors, or other active or passive microelectronic devices. The apparatus 700 may also include conventional or future-developed interconnects 798 interconnecting the MRAM stacks 760, 765 and/or the microelectronic devices 790. As such, the apparatus 700 may be or comprise a memory cell array and/or other type of integrated circuit device.

Figure 8:
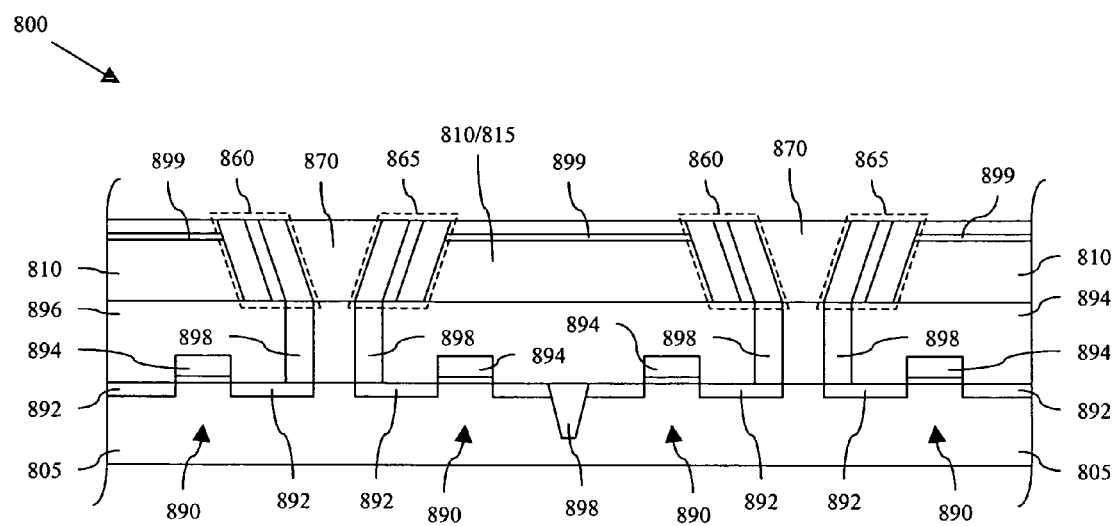
FIG. 8 is a sectional view of at least a portion of one embodiment of an apparatus according to aspects of the present disclosure.

Referring to FIG. 8, illustrated is a perspective view of at least a portion of one embodiment of an apparatus 800 according to aspects of the present disclosure. The apparatus 800 is one environment in which any of the above-described apparatus 300, 400, 500, 600, 700 may be implemented. The apparatus 800 includes one or more memory cells each including one or more MRAM stacks 860, 865, each of which may be substantially similar in composition and manufacture to one of the MRAM stacks 360, 365 shown in FIG. 3*f*.

The apparatus 800 also includes one or more pillars 810, 815 formed over a substrate 805, each of which may be substantially similar in composition and manufacture to the pillars 310, 315 described above. The pillars 810, 815 may each have one or more surfaces oriented at an acute angle relative to the substrate 805. Such angularly offset surfaces may be substantially planar, as illustrated in FIG. 7, or substantially cylindrical, as described with regard to FIG. 6. However, the sloped surfaces of the pillars 810, 815 may also have configurations other than the substantially planar and substantially cylindrical configurations described above. Ones of the pillars 810, 815 may also have more than one sloped surface, such as the pillar 810/815 indicated in FIG. 8.

The MRAM stacks 860, 865 are formed over the sloped surfaces of the pillars 810, 815. That is, the MRAM stacks 860, 865 may be formed on the sloped surfaces of the pillars 810, 815 or, in some embodiments, one or more additional layers, features, or components may interpose the MRAM stacks 860, 865 and their corresponding pillars 810, 815. Each of the MRAM stacks 860, 865 may substantially conform to the angularly offset surfaces of the pillars 810, 815, such that each of the MRAM stacks 860, 865 are also oriented at an acute angle relative to the substrate The apparatus 800 may also include one or more central members 870 each interposing and possibly contacting proximate ones of the MRAM stacks 860, 865. The central members 870 may each be substantially similar in composition and manufacture to the central member 370 described above. For example, the central members 870 may each comprise magnetic, electrically conductive, and/or dielectric material, as may be needed to interconnect the MRAM stacks 860, 865. Moreover, each of the central members 870 need not have identical compositions, such that one or more of the central members 870 may be electrically conductive whereas one of more other central members 870 may substantially comprise dielectric material.

The apparatus 800 may also include one or more microelectronic devices 890, possibly interconnected with one or more of the MRAM stacks 860, 865. For example, in the illustrated embodiment, the microelectronic devices 890 are field effect transistors each having source/drain regions 892 formed in the substrate 805 and gate electrodes 894 formed in a dielectric layer 896 formed over the substrate 805. However, other types of microelectronic devices 890 may also be employed within the scope of the present disclosure. For example, the microelectronic devices 890 may be or comprise transistors other than field effect transistors, or other active or passive microelectronic devices.

The apparatus 800 may also include isolation structures 898 interposing ones of the source/drain regions 892 and/or other components of the microelectronic devices 890. The isolation structures 898 may be or comprise field oxide regions, shallow trench isolation, local oxidation of silicon (LOCOS), and/or other conventional or future-developed isolation structures. As such, the isolation structures 898 may comprise silicon dioxide and/or other dielectric materials.

The apparatus 800 may also include conventional or future-developed interconnects 898 interconnecting the MRAM stacks 860, 865 and/or the microelectronic devices 890. As such, the apparatus 800 may be or comprise an integrated circuit device. The apparatus 800 may also include interconnects 899 which may be formed in the pillars 810, 815 prior to forming the sloped surfaces of the pillars 810, 815 or the MRAM stacks 860, 865.

Thus, the present disclosure provides an apparatus comprising, in at least one embodiment, a pillar located over a substrate and having at least one sloped surface oriented at an acute angle relative to the substrate. The apparatus may also comprise an MRAM stack substantially conforming to the sloped surface, the MRAM stack thereby also oriented at the acute angle relative to the substrate. In one embodiment, the sloped surface may be a sloped sidewall of the pillar. The MRAM stack may comprise a plurality of substantially planar, parallel layers each oriented at an acute angle relative to the substrate.

The present disclosure also introduces an apparatus comprising, in at least one embodiment, first and second substantially coplanar pillars located over a substrate and laterally opposing an MRAM stack having a plurality of layers. At least one of the plurality of MRAM stack layers substantially conforms to a surface of one of the first and second pillars that is oriented at an acute angle relative to the substrate.

Another embodiment of an apparatus according to aspects of the present disclosure comprises a first pillar located over a substrate and having a first surface oriented at a first acute angle relative to the substrate, and a second pillar located over the substrate and having a second surface oriented at a second acute angle relative to the substrate. Such an embodiment also includes a first MRAM stack interposing the first and second pillars and including a first plurality of layers, wherein at least one of the first plurality of layers substantially conforms to the first surface of the first pillar, and a second MRAM stack interposing the first MRAM stack and the second pillar and including a second plurality of layers, wherein at least one of the second plurality of layers substantially conforms to the second surface of the second pillar.

A method which may be employed, for example, in the formation of an apparatus comprising an angularly oriented MRAM stack is also provided in the present disclosure. In at least one embodiment, the method includes forming a pillar over a substrate, the pillar having a sloped surface oriented at an acute angle relative to the substrate. The method also includes forming an MRAM stack having a plurality of layers, wherein at least one of the plurality of layers substantially conforms to the pillar surface oriented at an acute angle relative to the substrate.

The foregoing has outlined features of several embodiments according to aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that these and other such equivalent constructions do not depart from the spirit and scope of the present disclosure, and that they may make various changes, substitutions and alterations herein without departing from the spirit and scope of the present disclosure.

What is claimed is:

1. An apparatus, comprising:
   a first pillar located over a substrate and having at least one sloped surface oriented at a first acute angle relative to the substrate;
   a second pillar located over the substrate and having at least one sloped surface oriented at a second acute angle relative to the substrate;
   a first MRAM stack having a first magnetic layer substantially conforming to the sloped surface of the first pillar, a first dielectric layer substantially conforming to the first magnetic layer, and a second magnetic layer substantially conforming to the first dielectric layer, whereby each of the layers of the first MRAM stack is oriented at the first acute angle relative to the substrate; and
   a second MRAM stack having a third magnetic layer substantially conforming to the sloped surface of the second pillar, a second dielectric layer substantially conforming to the third magnetic layer, and a fourth magnetic layer substantially conforming to the second dielectric layer, whereby each of the layers of the second MRAM stack is oriented at the second acute angle relative to the substrate;
   wherein the first and second MRAM stacks, collectively, are located between the sloped surface of the first pillar and the sloped surface of the second pillar.

2. The apparatus of claim 1 wherein each of the first and second pillars comprises electrically conductive material.

3. The apparatus of claim 1 wherein each of the first and second pillars comprises dielectric material.

4. The apparatus of claim 1 wherein each of the first and second pillars comprises magnetic material.

5. The apparatus of claim 1 wherein a distal corner of each of the first and second pillars relative to the substrate is rounded.

6. The apparatus of claim 1 wherein each of the first and second acute angles ranges between about 60 degrees and about 88 degrees.

7. The apparatus of claim 1 wherein each of the first and second acute angles ranges between about 70 degrees and about 80 degrees.

8. The apparatus of claim 1 wherein the first magnetic layer is one of a first free magnetic layer and a first pinned magnetic layer, the second magnetic layer is the other of the first free magnetic layer and the first pinned magnetic layer, the third magnetic layer is one of a second free magnetic layer and a second pinned magnetic layer, and the fourth magnetic layer is the other of the second free magnetic layer and the second pinned magnetic layer.

9. The apparatus of claim 8 wherein each of the first and second dielectric layers is a tunneling layer.

10. The apparatus of claim 8 wherein the first pillar includes a first substantially parallel surface relative to the substrate, wherein the second pillar includes a second substantially parallel surface relative to the substrate, wherein ends of each of the first dielectric layer, the first free magnetic layer and the first pinned magnetic layer are substantially coplanar with the first substantially parallel pillar surface, and wherein ends of each of the second dielectric layer, the second free magnetic layer and the second pinned magnetic layer are substantially coplanar with the second substantially parallel pillar surface.

11. The apparatus of claim 8 wherein the first pillar includes two first substantially parallel surfaces relative to the substrate, wherein the second pillar includes two second substantially parallel surfaces relative to the substrate, wherein opposing ends of each of the first dielectric layer, the first free magnetic layer and the first pinned magnetic layer are each substantially coplanar with a corresponding one of the two first substantially parallel pillar surfaces, and wherein opposing ends of each of the second dielectric layer, the second free magnetic layer and the second pinned magnetic layer are each substantially coplanar with a corresponding one of the two second substantially parallel pillar surfaces.

12. The apparatus of claim 1 wherein the at least one sloped pillar surface of the first pillar is substantially planar, and wherein the at least one sloped pillar surface of the second pillar is substantially planar.

13. The apparatus of claim 1 wherein the at least one sloped pillar surface of the first pillar is substantially cylindrical, and wherein the at least one sloped pillar surface of the second pillar is substantially cylindrical.

14. An apparatus, comprising:
   first and second substantially coplanar pillars located over a substrate and laterally opposing a first MRAM stack and a second MRAM stack, collectively, the first MRAM stack having a plurality of first layers, and the second MRAM stack having a plurality of second layers, wherein each of the plurality of first layers substantially conforms to a surface of one of the first and second pillars that is oriented at a first acute angle relative to the substrate, and wherein each of the plurality of second layers substantially conforms to a surface of another of the first and second pillars that is oriented at a second acute angle relative to the substrate.

15. The apparatus of claim 14 wherein the first acute angle is oriented in a first direction relative to the substrate and the second acute angle is oriented in a second direction relative to the substrate, and wherein the first and second directions are opposite.

16. The apparatus of claim 14 wherein a first interface between two adjacent ones of the plurality of first layers is oriented at the first acute angle relative to the substrate, and wherein a second interface between two adjacent ones of the plurality of second layers is oriented at the second acute angle relative to the substrate.

17. An apparatus, comprising:
   a first pillar located over a substrate and having a first surface oriented at a first acute angle relative to the substrate;
   a second pillar located over the substrate and having a second surface oriented at a second acute angle relative to the substrate;
   a first MRAM stack interposing the first and second pillars and including a first plurality of layers, wherein at least one of the first plurality of layers substantially conforms to the first surface of the first pillar;
   a second MRAM stack interposing the first MRAM stack and the second pillar and including a second plurality of layers, wherein at least one of the second plurality of layers substantially conforms to the second surface of the second pillar; and a central member interposing the first and second MRAM stacks, wherein the central member comprises a material selected from the group consisting of: magnetic material, ferromagnetic material, anti-ferromagnetic material, and hard-magnetic material.

18. The apparatus of claim 17 wherein a first lateral component of the first acute angle is laterally opposite a second lateral component of the second acute angle.

19. The apparatus of claim 17 wherein the first and second pillars each comprise dielectric material.

20. The apparatus of claim 17 wherein the central member comprises dielectric material.

21. The apparatus of claim 17 wherein the central member comprises electrically conductive material.

22. The apparatus of claim 17 wherein the central member is substantially coplanar with the first and second pillars.

23. The apparatus of claim 17 wherein the first MRAM stack is one of a first plurality of MRAM stacks each substantially conforming to the first surface of the first pillar and thereby each oriented at the first acute angle relative to the substrate, and wherein the second MRAM stack is one of a second plurality of MRAM sacks each substantially conforming to the second surface of the second pillar and thereby each oriented at the second acute angle relative to the substrate.

24. The apparatus of claim 17 wherein the first pillar is one of a plurality of substantially similar first pillars, the second pillar is one of a plurality of substantially similar second pillars each oriented proximate one of the plurality of first pillars, the first MRAM stack is one of a plurality of substantially similar first MRAM stacks, and the second MRAM stack is one of a plurality of substantially similar second MRAM stacks each oriented proximate one of the plurality of first MRAM stacks, wherein each corresponding pair of first and second MRAM stacks from the pluralities of first and second MRAM stacks interposes a corresponding pair of first and second pillars from the pluralities of first and second pillars.

25. The apparatus of claim 24 further comprising a plurality of microelectronic devices formed at least partially in the substrate and interconnected with ones of the pluralities of first and second MRAM stacks by ones of a plurality of interconnects.

26. A method, comprising:
forming a first pillar over a substrate, the first pillar having a first sloped surface oriented at a first acute angle relative to the substrate;
forming a second pillar over the substrate, the second pillar having a second sloped surface oriented at a second acute angle relative to the substrate;
forming a first MRAM stack having a plurality of first layers, wherein each of the plurality of first layers substantially conforms to the first pillar surface oriented at the first acute angle relative to the substrate; and
forming a second MRAM stack having a plurality of second layers, wherein each of the plurality of second layers substantially conforms to the second pillar surface oriented at the second acute angle relative to the substrate.

27. The method of claim 26 wherein forming the first pillar and forming the second pillar collectively includes:
depositing a pillar material layer over the substrate; and
forming the first sloped surface and the second sloped surface by removing a portion of the pillar material layer.

28. The method of claim 27 wherein removing a portion of the pillar material layer includes etching a portion of the pillar material layer.

29. The method of claim 26 further comprising forming a central member interposing the first and second MRAM stacks, wherein the central member comprises a material selected from the group consisting of: magnetic material, ferromagnetic material, anti-ferromagnetic material, and hard-magnetic material.

30. The method of claim 26 wherein the first sloped pillar surface is substantially planar and wherein the second sloped pillar surface is substantially planar.

31. The method of claim 26 wherein the first sloped pillar surface is substantially cylindrical and wherein the second sloped pillar surface is substantially cylindrical.

32. The method of claim 26 wherein each of the first and second acute angles ranges between about 60 degrees and about 88 degrees.

33. The method of claim 26 wherein a first interface between two adjacent ones of the plurality of first layers is oriented at the first acute angle relative to the substrate, and wherein a second interface between two adjacent ones of the plurality of second layers is oriented at the second acute angle relative to the substrate.

34. An apparatus, comprising:
a pillar located over a substrate and having at least one sloped surface oriented at an acute angle relative to the substrate; and
an MRAM stack substantially conforming to the sloped surface, the MRAM stack thereby also oriented at the acute angle relative to the substrate;
wherein the pillar comprises a material selected from the group consisting of: magnetic material, ferromagnetic material, anti-ferromagnetic material, and hard-magnetic material.

35. An apparatus, comprising:
a first pillar located over a substrate and having at least one sloped surface oriented at a first acute angle relative to the substrate;
a second pillar located over the substrate and having at least one sloped surface oriented at a second acute angle relative to the substrate;
a first MRAM stack having a plurality of first layers each substantially conforming to the sloped surface of the first pillar; and
a second MRAM stack having a plurality of second layers each substantially conforming to the sloped surface of the second pillar;
wherein the first and second MRAM stacks, collectively, are located between the sloped surface of the first pillar and the sloped surface of the second pillar.

* * * * *